(12) United States Patent
Schuermann et al.

(10) Patent No.: US 9,240,407 B2
(45) Date of Patent: Jan. 19, 2016

(54) INTEGRATED DIODE ARRAY AND CORRESPONDING MANUFACTURING METHOD

(71) Applicant: Robert Bosch GmbH, Stuttgart (DE)

(72) Inventors: Gregor Schuermann, Reutlingen (DE); Hubert Benzel, Pliezhausen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/049,672

(22) Filed: Oct. 9, 2013

(65) Prior Publication Data
US 2014/0097511 A1   Apr. 10, 2014

(30) Foreign Application Priority Data
Oct. 10, 2012   (DE) .......................... 10 2012 218 414

(51) Int. Cl.
| | |
|---|---|
| H01L 25/00 | (2006.01) |
| H01L 27/08 | (2006.01) |
| H01L 27/14 | (2006.01) |
| H01L 21/00 | (2006.01) |
| G01J 5/00 | (2006.01) |
| H01L 29/66 | (2006.01) |
| H01L 27/146 | (2006.01) |
| G01J 5/08 | (2006.01) |
| H01L 21/762 | (2006.01) |
| G01J 5/02 | (2006.01) |

(52) U.S. Cl.
CPC .............. *H01L 27/0814* (2013.01); *G01J 5/00* (2013.01); *G01J 5/024* (2013.01); *G01J 5/0225* (2013.01); *G01J 5/0853* (2013.01); *H01L 21/00* (2013.01); *H01L 21/76229* (2013.01); *H01L 21/76289* (2013.01); *H01L 25/00* (2013.01); *H01L 27/14* (2013.01); *H01L 27/14649* (2013.01); *H01L 29/66136* (2013.01)

(58) Field of Classification Search
CPC ......................................................... H01L 27/08
USPC .......... 250/332, 338.1, 339.04; 257/419, 429, 257/431, 440, 603; 438/72
See application file for complete search history.

(56) References Cited

U.S. PATENT DOCUMENTS

| | | | | |
|---|---|---|---|---|
| 6,465,784 | B1 * | 10/2002 | Kimata ......................... | 250/332 |
| 6,541,298 | B2 * | 4/2003 | Iida et al. ........................ | 438/54 |
| 6,645,820 | B1 * | 11/2003 | Peng et al. .................... | 438/372 |
| 6,777,682 | B2 * | 8/2004 | Ishikawa et al. ............ | 250/338.4 |
| 7,067,810 | B2 * | 6/2006 | Shigenaka et al. ............ | 250/332 |
| 8,304,848 | B2 * | 11/2012 | Suzuki et al. ................. | 257/429 |
| 2001/0028035 | A1 * | 10/2001 | Iida et al. ................... | 250/338.4 |
| 2002/0139933 | A1 * | 10/2002 | Iida et al. ................... | 250/338.1 |

(Continued)

FOREIGN PATENT DOCUMENTS

| | | |
|---|---|---|
| DE | 10 2008 054 481 | 12/2008 |
| WO | WO 2007/147663 | 12/2007 |

*Primary Examiner* — Shaun Campbell
*Assistant Examiner* — Ismail Muse
(74) *Attorney, Agent, or Firm* — Kenyon & Kenyon LLP

(57) ABSTRACT

An integrated diode array and a corresponding manufacturing method are provided. The integrated diode array includes a substrate having an upper side, and a plurality of blocks of several diodes, which are positioned in a planar manner and are suspended at the substrate above a cavity situated below them in the substrate. The blocks are separated from one another by respective gaps, and within a specific block, the individual diodes are electrically insulated from one another by first STI trenches situated between them.

7 Claims, 5 Drawing Sheets

(56) References Cited

U.S. PATENT DOCUMENTS

| | | | |
|---|---|---|---|
| 2005/0178967 A1* | 8/2005 | Nakaki et al. ............ | 250/339.04 |
| 2007/0145274 A1* | 6/2007 | Iida ............................ | 250/338.4 |
| 2009/0146059 A1* | 6/2009 | Nakaki ..................... | 250/338.4 |
| 2009/0266987 A1* | 10/2009 | Honda et al. ............... | 250/338.4 |
| 2009/0275166 A1* | 11/2009 | Iinuma ........................... | 438/72 |
| 2009/0321641 A1* | 12/2009 | Park et al. ................. | 250/338.4 |
| 2010/0025584 A1* | 2/2010 | Sasaki et al. ............... | 250/338.4 |
| 2010/0203691 A1* | 8/2010 | Wu et al. ...................... | 438/217 |
| 2011/0002359 A1* | 1/2011 | Benzel et al. ................ | 374/178 |
| 2011/0073978 A1* | 3/2011 | Fujiwara et al. ............ | 257/440 |
| 2011/0211613 A1* | 9/2011 | Herrmann et al. ........... | 374/178 |
| 2012/0228497 A1* | 9/2012 | Suzuki et al. ................ | 250/332 |
| 2012/0241613 A1* | 9/2012 | Ishii et al. .................... | 250/330 |
| 2013/0026604 A1* | 1/2013 | Hsin et al. .................... | 257/603 |

\* cited by examiner

_US 9,240,407 B2_

INTEGRATED DIODE ARRAY AND CORRESPONDING MANUFACTURING METHOD

CROSS REFERENCE TO RELATED APPLICATION

The present application claims priority to Application No. DE 10 2012 218 414.7, filed in the Federal Republic of Germany on Oct. 10, 2012, which is expressly incorporated herein in its entirety by reference thereto.

FIELD OF INVENTION

The present invention relates to an integrated diode array and a corresponding manufacturing method.

BACKGROUND INFORMATION

German Application No. DE 10 2008 054 481 describes an integrated diode array in the form of a sensor, which includes at least one micropatterned diode pixel that has a diode formed in, on or under a diaphragm, the diaphragm being formed above a cavity. The diode is contacted via leads, which are formed at least partially in, on or under the diaphragm, the diode being formed in a polycrystalline semiconductor layer.

International Patent Publication No. WO 2007/147663 describes an infrared sensor having an array of diode pixels, each diode pixel having a monocrystalline region underneath a self-supporting diaphragm.

FIGS. 6a and 6b schematically show vertical cross-sectional views of an example of an integrated diode array for explaining a problem forming a basis of the present invention, FIG. 6b being an enlarged view of detail A in FIG. 6a.

In FIG. 6a, reference numeral 1 denotes a semiconductor substrate having an upper side O and a lower side U. A plurality of blocks 4a, 4b, of which only two blocks are shown in the view of FIG. 6a, are suspended or anchored at substrate 1, above a cavity 2 situated beneath them in substrate 1. Blocks 4a, 4b are anchored to substrate 1 by oxide ribs (not shown).

Blocks 4a, 4b have a plurality of diodes D1, D2 and D1', D2', respectively, which are positioned in a planar manner and are, in the present exemplary embodiment, infrared diodes, the blocks 4a, 4b representing pixels of an infrared sensor device. Blocks 4a, 4b are separated from one another by respective gaps 3.

Blocks 4a, 4b are each made up of a first n-type well 9, which is formed from a corresponding n-type epitaxial layer. A second well 8, which has the p-type of conduction, is provided in first well 9. Diodes D1, D2 and D1', D2' are formed inside of p-type well 8, each of these having a well 7 of the n-type of conduction and a doping region 6 of the p-type of conduction embedded in it. Upper side O of substrate 1, as well as blocks 4a, 4b, are covered by an insulating layer 10 of oxide.

For the sake of simplicity, the electrical contacting of diodes D1, D2 and D1', D2' is not shown in FIG. 6a. In FIG. 6b, this electrical contacting is partially shown in detail A of FIG. 6a.

In particular, contacts K1, K2 passing through insulating layer 10 are formed, which contact p-type doping region 6 and n-type well 7 of diode D1. A conductor track LB is shown connected to contact K1, the conductor track terminating in a bonding pad B, which may be contacted from above by a bonding wire that is not shown. A nitride passivation layer 12 is situated above contacts K1, K2 and conductor track LB.

In this example of an integrated diode array, due to light-generated, surface charge carriers (in this case, electrons) between n-type wells 7 of diodes D1, D2 and D1', D2', conductive, parasitic MOS channels may form between individual diodes D1, D2 and D1', D2' and thereby reduce the sensitivity of the sensor device. The formation of such MOS channels may be counteracted by appropriate gaps between diodes D1, D2 and D1', D2'. However, this is at the expense of the space occupied by the sensor device and therefore has a restrictive effect on further integration.

The example of the integrated diode array of FIGS. 6a and 6b is produced using a method known per se, in which cavity 2 is initially formed in the substrate, after which the corresponding dopings are provided for regions 6, 7, 8, 9. After that, diodes D1, D2 and D1', D2' are electrically contacted, and ultimately, blocks 4a, 4b are separated from one another by a suitable etching process, by which respective gaps 3 are produced between blocks 4a, 4b.

FIG. 7 shows a schematic vertical cross-sectional view of a further example of an integrated diode array.

In FIG. 7, reference characters D1a, D1a' denote individual diodes that are formed in blocks 41, 42, respectively. Blocks 41, 42 each contain an n-type well 9' of the n-type of conduction, in which p-type doping region 6' and n-type doping region 7' of specific diode D1a, D1a' are formed. Since, in this example, each block 41, 42 only contains a single diode D1a and D1a', no unwanted MOS channels are formed. However, this type of array is even more detrimental with regard to saving space.

FIG. 8 shows a schematic vertical cross-sectional view of another further example of an integrated diode array.

In comparison with FIG. 6a, the example according to FIG. 8 includes n-type doping regions 15 formed between individual diodes D1, D2 and D1', D2' of each block 4a, 4b. In their depth, these n-type doping regions 15 extend to n-type well 9 and may therefore prevent unwanted leakage currents. However, such n-type doping regions require space and increase the complexity of the manufacturing method.

SUMMARY

The present invention provides an integrated diode array, as well as a corresponding manufacturing method.

An idea forming a basis of the present invention is that the individual diodes within a specific block, which has a plurality of diodes positioned in it in a planar manner, are electrically insulated from one another by STI trenches situated between them (STI=shallow trench isolation).

The provision of such STI trenches allows the individual diodes to be designed to have little lateral spacing, or to be designed to directly border on the STI trenches. This results in a lateral reduction in size of the integrated diode array of the present invention, which means that, for example, more blocks or pixels fit on the same surface. On the other hand, more diodes may be accommodated per block or pixel, which may be used to markedly increase sensitivity. The sensor devices formed by the integrated diode array of the present invention may become smaller on the whole, and, for example, a thinner epitaxial layer may be used to form the blocks, which means that the pixel mass becomes smaller, and accordingly, the response time of the pixels decreases.

According to a preferred exemplary embodiment, the individual blocks have a first well of a first type of conduction (e.g., n) and a second well of the second type of conduction (e.g., p) inside of the first well, the plurality of diodes positioned in a planar manner inside of the second well being formed by respective first and second doping regions of the first and second type of conduction, and the first STI trenches extending into the first well. In this exemplary embodiment, the diodes within a block may be laid together very closely, so that the overall diode array becomes smaller.

According to a further preferred exemplary embodiment, the individual blocks have a first well of a first conduction type (e.g., n), the plurality of diodes positioned in a planar manner inside of the first well being formed by respective first and second doping regions of the first and second type of conduction, and the first STI trenches extending through the first well. This exemplary embodiment allows an even flatter design of the blocks, since a thinner epitaxial layer is sufficient.

According to a further preferred exemplary embodiment, the individual blocks have a first well of a first type of conduction (e.g., n), the plurality of diodes positioned in a planar manner being formed by the first well and a respective doping region of the second type of conduction (e.g., p) formed inside of the first well, and the first STI trenches extending through the first well. This exemplary embodiment allows a region (e.g., n-type region) of the diodes to not have to be specially doped, since, for example, the doping of a corresponding epitaxial layer may be used for it. This allows an even flatter embodiment of the blocks, and once again, space may also be saved laterally, since the diodes are bounded outwardly in the pixel, at the gaps, by the insulation of the STI trenches or the oxide layer. The flatter and laterally smaller pixels allow the mass of the pixels to be smaller, which means that the response time is less since less mass has to be heated up.

According to a further preferred exemplary embodiment, the plurality of diodes positioned in a planar manner have two STI trenches, which electrically insulate the p-n junctions of the individual diodes laterally. In the case of this exemplary embodiment having two STI trenches, which electrically insulate the p-n junctions of the individual diodes laterally, surface charges do not generate a leakage current at the p-n junction, which means that better resolution of the thermal image and a greater signal-to-noise ratio is attainable.

According to a further preferred exemplary embodiment, the individual blocks have a first doping region of a first type of conduction (e.g., n) and a second superjacent doping region of the second type of conduction (e.g., p), which are positioned such that the plurality of diodes arranged in a planar manner have a horizontal p-n junction, the first STI trenches extending through the first doping region and the second doping region situated above it. In the exemplary embodiment, the lateral projection of the lower diode region is eliminated, which means that the diodes may be configured to be even smaller, thereby allowing a further, marked reduction in size of the blocks or pixels. In addition, the process control becomes simpler, since only one type of STI trench must be provided.

According to a further preferred exemplary embodiment, the diodes are infrared diodes of an infrared sensor device, and the blocks are pixels of the infrared sensor device. Possible, special fields of application of such an integrated infrared diode array include a consumer application, e.g., measurement of thermal images in the private sphere or thermal image measurement for detecting heat losses on buildings. Further applications include automotive applications, such as detecting the bodies of people and/or animals at night, as well as driver assistance systems.

According to a further preferred exemplary embodiment, the first STI trenches are filled with an insulating material, in particular, an oxide or nitride. This ensures the stability of contacts running over them.

According to a further preferred exemplary embodiment, the individual blocks are insulated by a peripheral insulating layer, and on the upper side, contacts for the individual diodes being run through the insulating layer. This is an easily processable type of electrical contacting.

According to a further preferred exemplary embodiment, the individual diodes directly border on the first STI trenches laterally. This allows the gap between the diodes to be reduced to a minimum.

In the following, exemplary embodiments of the present invention are described in greater detail with reference to the accompanying drawings.

BRIEF DESCRIPTION OF THE DRAWINGS

FIGS. 6a and 6b show schematic vertical cross-sectional views of an example of an integrated diode array for explaining a problem forming a basis of the present invention, FIG. 6b being an enlarged view of detail A in FIG. 6a.

DETAILED DESCRIPTION

In the figures, identical or functionally equivalent elements are denoted by the same reference symbols.

Figure 1:
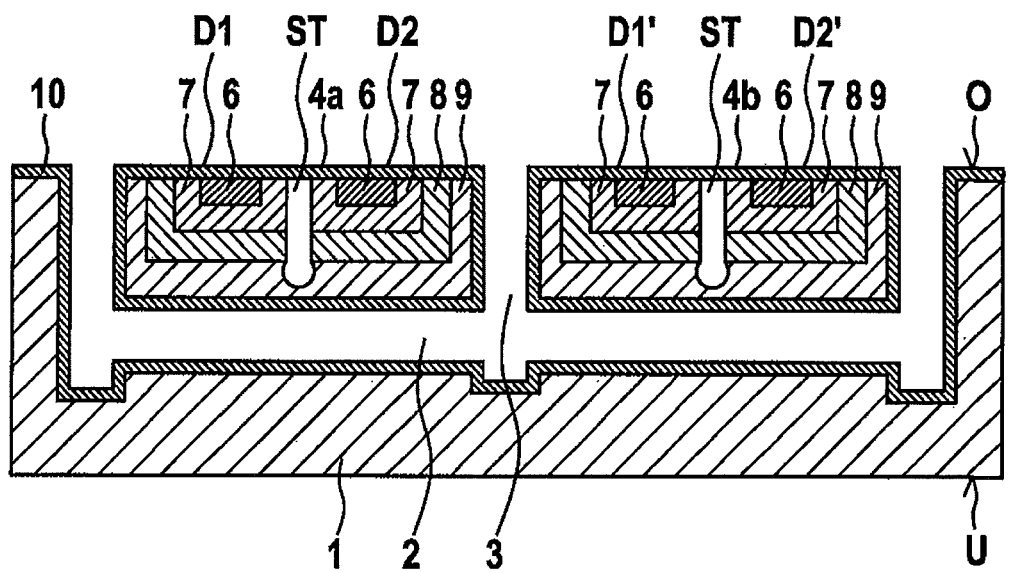
FIG. 1 shows a schematic vertical cross-sectional view of an integrated diode array according to a first exemplary embodiment of the present invention.

FIG. 1 shows a schematic vertical cross-sectional view of an integrated diode array according to a first exemplary embodiment of the present invention.

In FIG. 1, reference numeral 1 denotes a semiconductor substrate having an upper side O and a lower side U. A plurality of blocks 4a, 4b, of which only two blocks are shown in the view of FIG. 1, are suspended or anchored at substrate 1, above a cavity 2 situated beneath them in substrate 1. Blocks 4a, 4b are anchored to substrate 1 by oxide ribs (not shown).

Blocks 4a, 4b have a plurality of diodes D1, D2 and D1', D2', respectively, which are positioned in a planar manner and are, in the present exemplary embodiment, infrared diodes, the blocks 4a, 4b representing pixels of an infrared sensor device. Blocks 4a, 4b are separated from one another by respective gaps 3. In this context, the connection leads of the pixels may be implemented via the oxide ribs (not shown) of the anchoring.

Blocks 4a, 4b are each made up of a first n-type well 9, which is formed from a corresponding n-type epitaxial layer.

A second well 8, which has the p-type of conduction, is provided in first well 9. Diodes D1, D2 and D1', D2' are formed inside of p-type well 8, each of these having a well 7 of the n-type of conduction and a doping region 6 of the p-type of conduction embedded in it. Upper side O of substrate 1, as well as blocks 4a, 4b, are covered by an insulating layer 10 of oxide.

For the sake of simplicity, the electrical contacting of diodes D1, D2 and D1', D2' is not shown in FIG. 1 through FIG. 5. In FIG. 6b, this electrical contacting is partially shown in detail A of FIG. 6a, which has already been explained above.

In each instance, an STI trench ST is formed between diodes D1, D2 in first block 4a and diodes D1', D2' in second block 4b, the diodes D1, D2 and D1', D2' directly bordering on STI trench ST laterally.

For example, such STI trenches ST may be etched into the structure, using a perforated oxide mask, and sealed by an oxide filling, so that the electrical contacting for the diode terminals may be run across them.

In the exemplary embodiment according to FIG. 1, STI trenches ST extend from upper side O of blocks 4a, 4b, which corresponds to upper side O of substrate 1, into n-type well 9.

In the first exemplary embodiment, diodes D1, D2 and D1', D2' directly border on STI trenches ST. Such a refinement allows STI trenches ST to be produced in a self-aligning manner. Of course, it is also conceivable for another small region of p-type well 8 to remain between diodes D1, D2 and D1', D2'. This exemplary embodiment allows the distance of diodes D1, D2 and D1', D2' from one another to be laterally reduced in a more marked manner.

Figure 2:
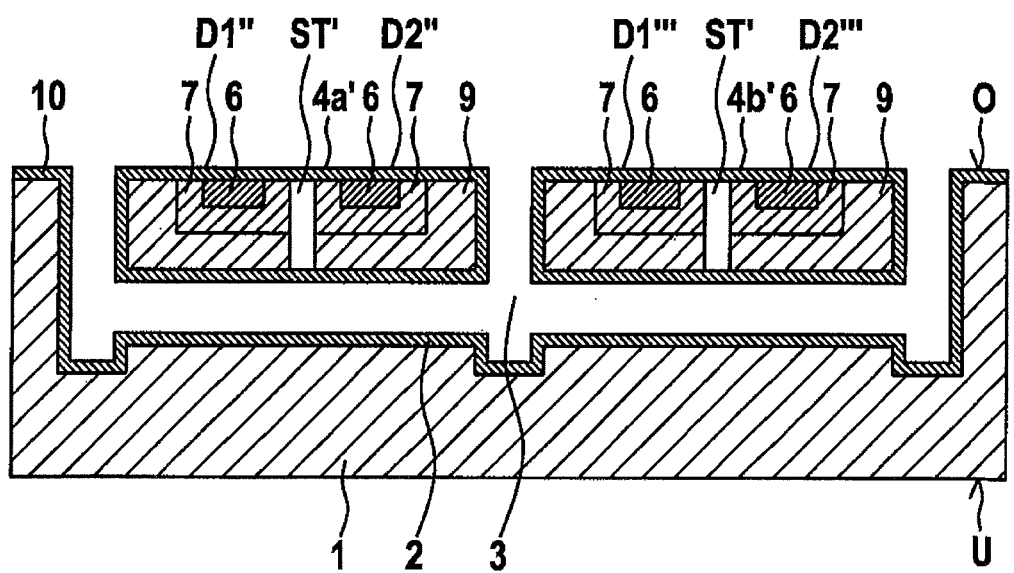
FIG. 2 shows a schematic vertical cross-sectional view of an integrated diode array according to a second exemplary embodiment of the present invention.

FIG. 2 shows a schematic vertical cross-sectional view of an integrated diode array according to a second exemplary embodiment of the present invention.

In the second exemplary embodiment according to FIG. 2, the blocks are denoted by 4a', 4b', the STI trenches are denoted by ST', and the diodes are denoted by D1'', D2'' and D1''', D2'''. In contrast to the first exemplary embodiment, in the second exemplary embodiment, p-type well 8 is not provided, which means that diodes D1'', D2'' and D1''', D2''' are formed directly inside of the n-type well in the epitaxial layer. In this connection, STI trenches ST' pass through the entire n-type well 9. Consequently, a flatter embodiment is possible.

Figure 3:
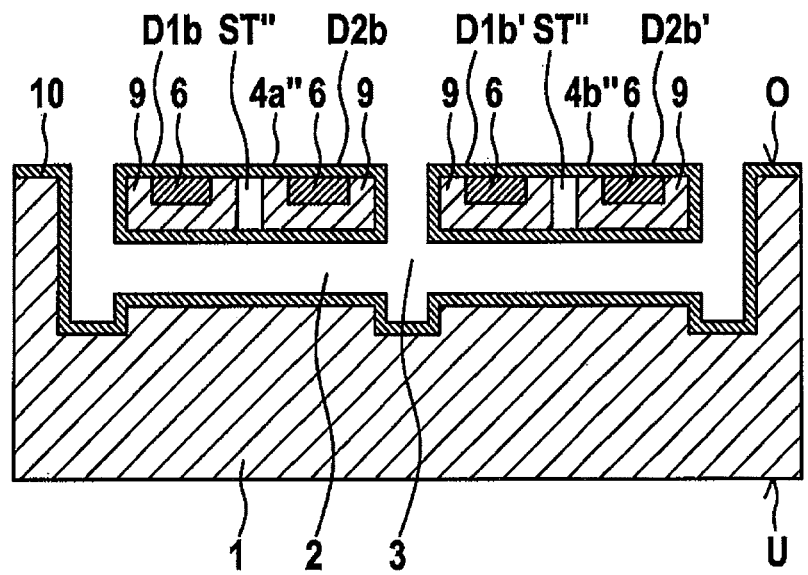
FIG. 3 shows a schematic vertical cross-sectional view of an integrated diode array according to a third exemplary embodiment of the present invention.

FIG. 3 shows a schematic vertical cross-sectional view of an integrated diode array according to a third exemplary embodiment of the present invention.

In the third exemplary embodiment of FIG. 3, the blocks are designated by 4a'', 4b'', the STI trenches are designated by ST''', and the diodes are designated by D1b, D2b and D1b', D2b'. In this case, n-type well 9 of the epitaxial layer forms the n-type region of diodes D1b, D2b and D1b', D2b'. Corresponding p-type doping regions 6 of diodes D1b, D2b and D1b', D2b' are provided inside of n-type well 9. A further reduction in thickness of the blocks is rendered possible by the elimination of n-type doping regions 7, which further reduces the thermal mass in a corresponding manner. In this third exemplary embodiment, STI trenches ST'' also pass through the blocks completely.

Figure 4:
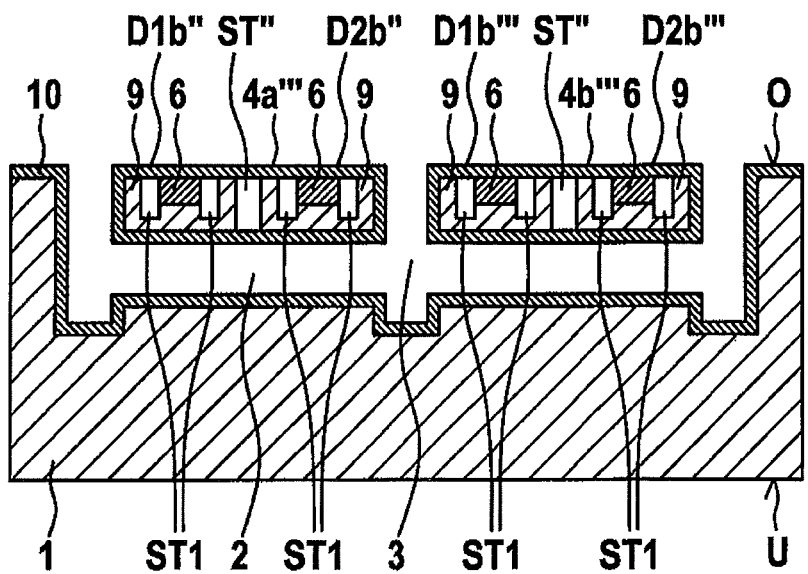
FIG. 4 shows a schematic vertical cross-sectional view of an integrated diode array according to a fourth exemplary embodiment of the present invention.

FIG. 4 shows a schematic vertical cross-sectional view of an integrated diode array according to a fourth exemplary embodiment of the present invention.

In contrast to the third exemplary embodiment, in the fourth exemplary embodiment, second STI trenches ST1 are provided inside of individual diodes D1b'', D2b'', D1b''', D2b''' in blocks 4a''', 4b''', the second STI trenches ST1 electrically insulating the p-n junctions of individual diodes D1b'', D2b'' and D1b''', D2b''' at the lateral edges. Consequently, surfaces charges may no longer generate a leakage current at the respective p-n junction.

Figure 5:
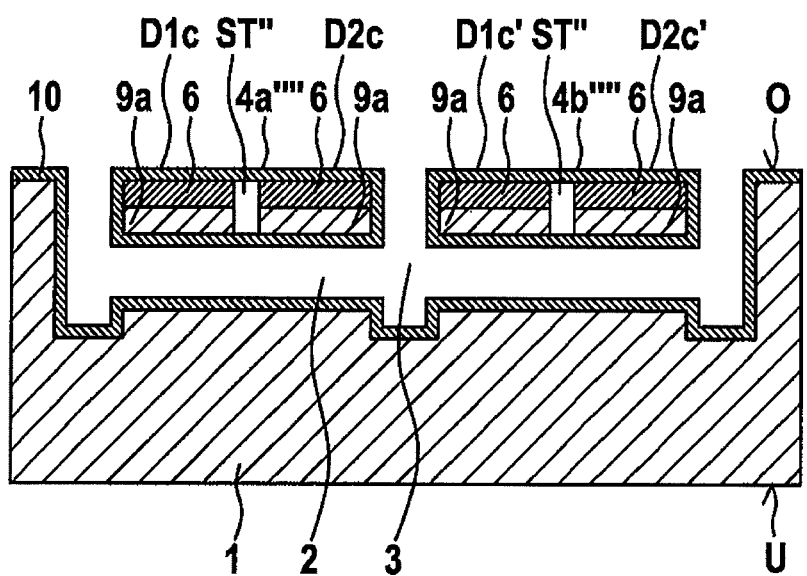
FIG. 5 shows a schematic vertical cross-sectional view of an integrated diode array according to a fifth exemplary embodiment of the present invention.
Figure 6A:
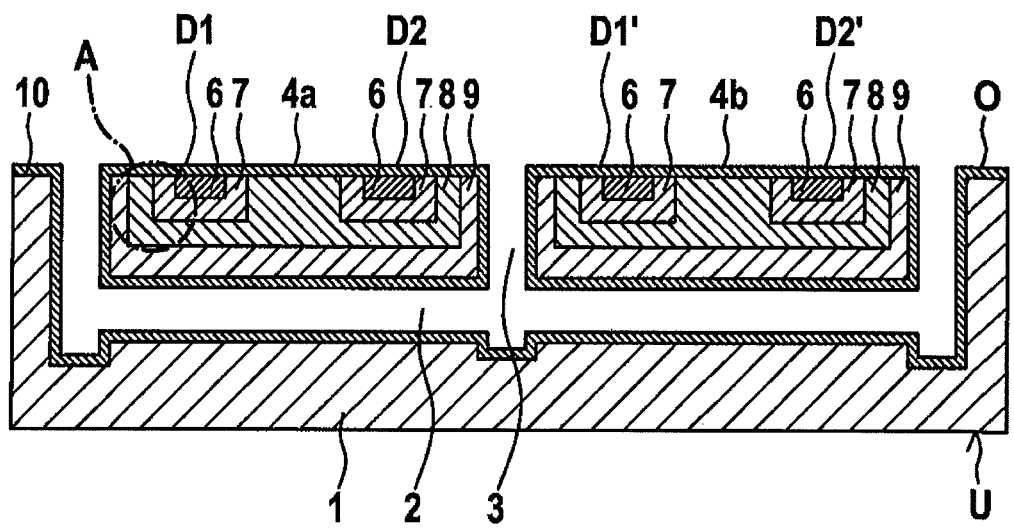
Figure 6B:
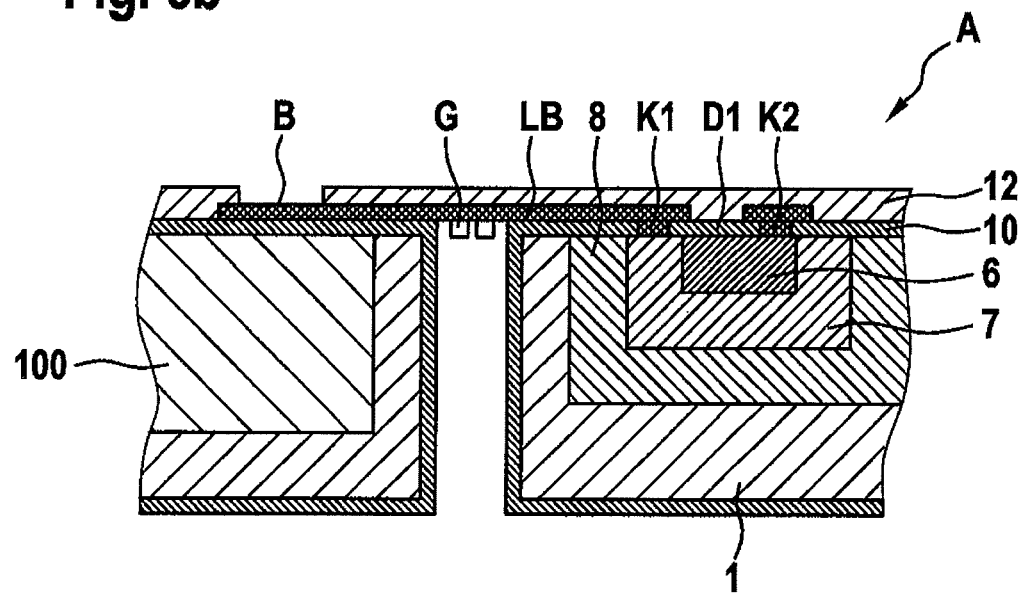
Figure 7:
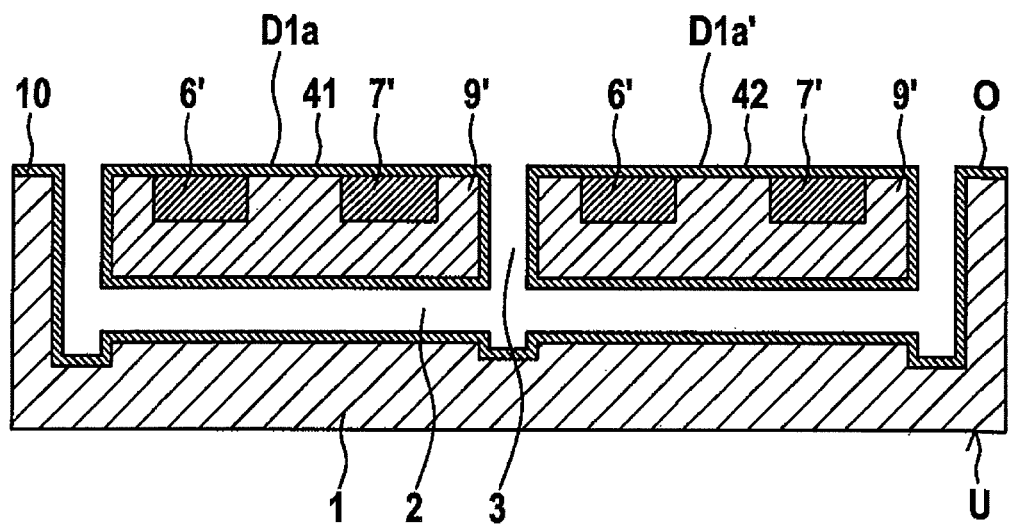
FIG. 7 shows a schematic vertical cross-sectional view of a further example of an integrated diode array.
Figure 8:
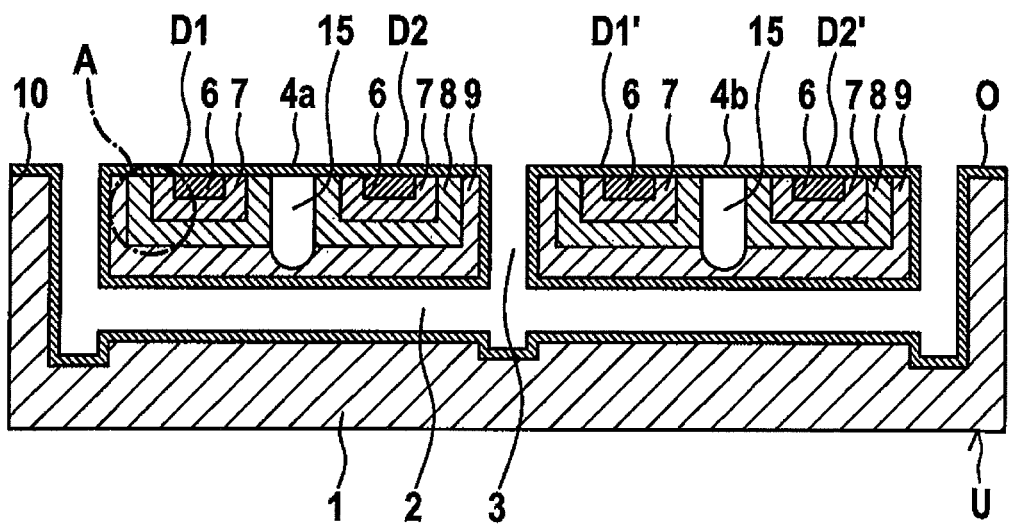
FIG. 8 shows a schematic vertical cross-sectional view of a further example of an integrated diode array.

FIG. 5 shows a schematic vertical cross-sectional view of an integrated diode array according to a fifth exemplary embodiment of the present invention.

In the fifth exemplary embodiment, the blocks are denoted by reference numerals 4a'''', 4b'''', and the corresponding diodes are denoted by reference numerals D1c, D2c and D1c', D2c'. In this exemplary embodiment, the diodes are made up of a lower n-type doping region 9a and an upper p-type doping region 6, STI trenches ST'' being provided between the diodes. Since n-type doping region 9a is no longer provided as a well, a further lateral reduction in size of the individual diodes is produced.

Although the present invention was completely described above in terms of preferred exemplary embodiments, it is not limited to them, but rather is modifiable in numerous ways.

Although the present invention was explained in light of integrated diode arrays in the form of infrared sensor devices, it is not limited to them, but is applicable, in principle, to any integrated diode array.

What is claimed is:

1. An integrated diode array, comprising:
   a substrate having an upper side; and
   a plurality of blocks each having a plurality of diodes, which are positioned in a planar manner and are suspended at the substrate above a cavity situated below the blocks in the substrate;
   wherein the blocks are separated from one another by respective gaps and wherein individual blocks include a first well of a first conduction type and a second well of a second conduction type inside the first well; and
   wherein individual diodes inside a respective block are electrically insulated from one another by first STI trenches situated between the individual diodes, and wherein the plurality of diodes positioned in a planar manner are formed inside the second well by first and second doping regions of the first and second conduction types, respectively, and
   wherein the first STI trenches extend into the first well.

2. An integrated diode array, comprising:
   a substrate having an upper side; and
   a plurality of blocks each having a plurality of diodes, which are positioned in a planar manner and are suspended at the substrate above a cavity situated below the blocks in the substrate;
   wherein the blocks are separated from one another by respective gaps; and
   wherein individual diodes inside a respective block are electrically insulated from one another by first STI trenches situated between the individual diodes,
   wherein individual blocks include a first doping region of a first conduction type and a superjacent second doping region of a second conduction type, which are positioned such that the plurality of diodes positioned in a planar manner have a horizontal p-n junction; and
   wherein the first STI trenches extend through the first doping region and the superjacent second doping region.

3. A method for manufacturing an integrated diode array, comprising:
   providing a substrate having an upper side;
   forming a plurality of blocks each having a plurality of diodes, which are positioned in a planar manner and are suspended at the substrate above a cavity situated under the blocks in the substrate;
   separating the blocks from one another by respective gaps, wherein individual blocks include a first well of a first conduction type and a second well of a second conduction type inside the first well; and electrically insulating individual diodes within a respective block from one another by first STI trenches situated between the individual diodes, wherein the plurality of diodes positioned in a planar manner are formed inside the second well by first and second doping regions of the first and second conduction types, respectively, and wherein the first STI trenches extend into the first well.

4. The integrated diode array according to claim 1, wherein the plurality of diodes are infrared diodes of an infrared sensor device, and the plurality of blocks are pixels of the infrared sensor device.

5. The integrated diode array according to claim 1, wherein the first STI trenches are filled with an insulating material, an oxide, or a nitride.

6. The integrated diode array according to claim 1, wherein individual blocks are insulated by a peripheral insulating layer; and wherein on the upper side, contacts for the individual diodes are run through the insulating layer.

7. The integrated diode array according to claim 1, wherein individual diodes directly border on the first STI trenches laterally.

* * * * *